(12) United States Patent
Gadkaree et al.

(10) Patent No.: US 7,790,565 B2
(45) Date of Patent: *Sep. 7, 2010

(54) SEMICONDUCTOR ON GLASS INSULATOR MADE USING IMPROVED THINNING PROCESS

(75) Inventors: Kishor Purushottam Gadkaree, Big Flats, NY (US); Michael John Moore, Corning, NY (US); Mark Andrew Stocker, Painted Post, NY (US); Jiangwei Feng, Painted Post, NY (US); Joseph Frank Mach, Lindley, NY (US)

(73) Assignee: Corning Incorporated, Corning, NY (US)

( * ) Notice: Subject to any disclaimer, the term of this patent is extended or adjusted under 35 U.S.C. 154(b) by 337 days.

This patent is subject to a terminal disclaimer.

(21) Appl. No.: 11/729,895

(22) Filed: Mar. 29, 2007

(65) Prior Publication Data

US 2007/0249139 A1 Oct. 25, 2007

Related U.S. Application Data

(60) Provisional application No. 60/793,822, filed on Apr. 21, 2006.

(51) Int. Cl.
*H01L 21/76* (2006.01)

(52) U.S. Cl. .............. 438/407; 257/347; 257/E21.48; 257/E21.561; 257/E21.57; 438/455

(58) Field of Classification Search .............. 257/347, 257/E21.48, E27.112, E21.561, E21.57, E21.704; 438/407, 149, 455, 400, 404, 458
See application file for complete search history.

(56) References Cited

U.S. PATENT DOCUMENTS

| | | | |
|---|---|---|---|
| 4,994,694 A | 2/1991 | Gross | 307/570 |
| 5,876,497 A | 3/1999 | Atoji | 117/85 |
| 6,413,874 B1 | 7/2002 | Sato | 438/714 |
| 7,071,077 B2 | 7/2006 | Maleville et al. | 438/455 |
| 7,176,528 B2* | 2/2007 | Couillard et al. | 257/347 |
| 7,312,153 B2 | 12/2007 | Coletti et al. | 438/690 |
| 7,456,080 B2* | 11/2008 | Gadkaree | 438/407 |
| 2004/0043698 A1 | 3/2004 | Jiang et al. | 451/5 |
| 2004/0229444 A1* | 11/2004 | Couillard et al. | 438/455 |
| 2005/0085049 A1* | 4/2005 | Atwater et al. | 438/455 |
| 2005/0215038 A1 | 9/2005 | Hall et al. | 438/583 |
| 2005/0250277 A1* | 11/2005 | Chang et al. | 438/202 |
| 2005/0255670 A1 | 11/2005 | Couillard et al. | 438/455 |

OTHER PUBLICATIONS

Rodica Iosub, et al., Silicon Membranes Fabrication By Wet Anisotropic Etching, Sensors And Actuators, A99. pp. 104-111 (2002).
Gregory T. A. Kovacs, et al., Bulk Micromachining of Silicon, IEEE, vol. 86, No. 8, pp. 1536-1551 (Aug. 1998).

* cited by examiner

*Primary Examiner*—W. David Coleman
*Assistant Examiner*—Su C Kim
(74) *Attorney, Agent, or Firm*—Bruce P. Watson; Timothy M. Schaeberle

(57) ABSTRACT

Methods and apparatus for producing a semiconductor on glass (SiOG) structure include: subjecting an implantation surface of a donor semiconductor wafer to an ion implantation process to create an exfoliation layer in the donor semiconductor wafer; bonding the implantation surface of the exfoliation layer to a glass substrate using electrolysis; separating the exfoliation layer from the donor semiconductor wafer, thereby exposing at least one cleaved surface; and subjecting the at least one cleaved surface to a wet etching process.

28 Claims, 6 Drawing Sheets

FIG. 2

202 PREPARE SURFACE OF DONOR SEMICONDUCTOR WAFER

204 SUBJECT DONOR SEMICONDUCTOR WAFER TO AN ION IMPLANTATION PROCESS

206 SUBJECT THE EXFOLIATION LAYER TO MILD OXIDATION

208 BOND THE EXFOLIATION LAYER TO THE GLASS SUBSTRATE USING ELECTROLYSIS

210 SEPARATE THE GLASS LAYER / EXFOLIATION LAYER FROM THE DONOR SEMICONDUCTOR WAFER

212 SUBJECT THE GLASS LAYER / EXFOLIATION LAYER TO LOW TEMPERATURE WET ETCH PROCESS

214 SUBJECT THE EXPOSED EXFOLIATION LAYER TO A BUFFING PROCESS

SEMICONDUCTOR ON GLASS INSULATOR MADE USING IMPROVED THINNING PROCESS

CROSS-REFERENCE TO RELATED APPLICATION

This application claims the benefit of priority to the U.S. Provisional Application No. 60/793,822, filed on Apr. 21, 2006, the content of which is relied upon and incorporated herein by reference in its entirety.

BACKGROUND

The present invention relates to the manufacture of a semiconductor-on-insulator (SOI) structure using an improved film thinning process.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, and displays, such as, active matrix displays. SOI structures may include a thin layer of substantially single crystal silicon (generally 0.1-0.3 microns in thickness but, in some cases, as thick as 5 microns) on an insulating material.

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SiOG abbreviation is used to refer to semiconductor-on-glass structures in general, including, but not limited to, silicon-on-glass structures. The SiOG nomenclature is also intended to include semiconductor-on-glass-ceramic structures, including, but not limited to, silicon-on-glass-ceramic structures. The abbreviation SOI encompasses SiOG structures.

Various ways of obtaining SOI structures wafer include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 5,374,564 discloses a process to obtain a single crystal silicon film on a substrate using a thermal process. A silicon wafer having a planar face is subject to the following steps: (i) implantation by bombardment of a face of the silicon wafer by means of ions creating a layer of gaseous micro-bubbles defining a lower region of the silicon wafer and an upper region constituting a thin silicon film; (ii) contacting the planar face of the silicon wafer with a rigid material layer (such as an insulating oxide material); and (iii) a third stage of heat treating the assembly of the silicon wafer and the insulating material at a temperature above that at which the ion bombardment was carried out. The third stage employs temperatures sufficient to bond the thin silicon film and the insulating material together, to create a pressure effect in the micro-bubbles, and to cause a separation between the thin silicon film and the remaining mass of the silicon wafer. (Due to the high temperature steps, this process does not work with lower cost glass or glass-ceramic substrates.)

U.S. Patent Application No.: 2004/0229444 discloses a process that produces an SiOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer.

The resulting SOI structure just after exfoliation might exhibit excessive surface roughness (e.g., about 10 nm or greater), excessive silicon layer thickness (even though the layer is considered "thin"), and implantation damage of the silicon layer (e.g., due to the formation of an amorphized silicon layer). Some have suggested using chemical mechanical polishing (CMP) to further process the SOI structure after the thin silicon film has been exfoliated from the silicon material wafer. Disadvantageously, however, the CMP process does not remove material uniformly across the surface of the thin silicon film during polishing. Typical surface non-uniformities (standard deviation/mean removal thickness) are in the 3-5% range for semiconductor films. As more of the silicon film's thickness is removed, the variation in the film thickness correspondingly worsens.

The above shortcoming of the CMP process is especially a problem for some silicon on glass applications because, in some cases, as much as about 300-400 nm of material needs to be removed to obtain a desired silicon film thickness. For example, in thin film transistor (TFT) fabrication processes, a silicon film thickness in the 100 nm range or less may be desired. Additionally, a low surface roughness may also be desirable for a TFT structure.

Another problem with the CMP process is that it exhibits particularly poor results when rectangular SOI structures (e.g., those having sharp corners) are polished. Indeed, the aforementioned surface non-uniformities are amplified at the corners of the SOI structure compared with those at the center thereof. Still further, when large SOI structures are contemplated (e.g., for photovoltaic applications), the resulting rectangular SOI structures are too large for typical CMP equipment (which are usually designed for the 300 mm standard wafer size). Cost is also an important consideration for commercial applications of SOI structures. The CMP process, however, is costly both in terms of time and money. The cost problem may be significantly exacerbated if non-conventional CMP machines are required to accommodate large SOI structure sizes.

SUMMARY OF THE INVENTION

In accordance with one or more embodiments of the present invention, methods and apparatus of forming a semiconductor on glass structure, include: subjecting an implantation surface of a donor semiconductor wafer to an ion implantation process to create an exfoliation layer in the donor semiconductor wafer; bonding the implantation surface of the exfoliation layer to the glass substrate using electrolysis; separating the exfoliation layer from the donor semiconductor wafer, thereby exposing at least one cleaved surface; and subjecting the at least one cleaved surface to a wet etching process.

The wet etch process may be carried out at a temperature of between about 20-100° C. without employing a hydrogen annealing process before or after the wet etching process. The wet etching process may be conducted at a temperature of between about 20-60° C., for example, at 25° C.

The at least one cleaved surface may include a first cleaved surface of the donor semiconductor wafer and a second cleaved surface of the exfoliation layer. The step of wet etching may be applied to the second cleaved surface of the exfoliation layer and/or the first cleaved surface of the donor semiconductor wafer.

The wet etching process may include subjecting the at least one cleaved surface to one, or both, of an acid solution and a base solution. By way of example, the acid solution may include at least one of hydrofluoric acid, nitric acid, and acetic acid. If a base solution is used, the solution may include one or more of KOH, NH4OH, tetramethyl ammonium hydroxide (TMAH). The solution may alternatively or additionally include an additive, such as isopropyl alcohol, hydrogen peroxide or ozonated deionized water.

The etching process may include subjecting the at least one cleaved surface to agitation of a solution containing the etchant. For example, the agitation may include at least one of stirring the solution, magnetic stirring of the solution, ultrasonic wave propagation within the solution, megasonic wave propagation within the solution and spray application of the solution.

It is noted that the donor semiconductor wafer may be a part of structure that includes a substantially single crystal donor semiconductor wafer and optionally includes an epitaxial semiconductor layer disposed on the donor semiconductor wafer. The exfoliated layer (e.g., the layer bonded to the glass substrate and separated from the donor semiconductor structure) may thus be formed substantially from the single crystal donor semiconductor wafer material. Alternatively, the exfoliated layer may be formed substantially from the epitaxial semiconductor layer (and which may also include some of the single crystal donor semiconductor wafer material).

The aforementioned wet etching process may be applied to the exfoliated layer irrespective of whether it is formed substantially from the single crystal donor semiconductor wafer material or from the epitaxial semiconductor layer.

Additionally or alternatively, the process may further include subjecting the etched surface of the exfoliated layer and/or subjecting the etched surface of the donor semiconductor wafer (or structure) to polishing. The polishing step may include polishing the etched surface using a silica based slurry or similar material known in the art in the semiconductor industry. The polishing pressure may be between about 1 and 100 psi, the polishing platen speed may be between about 25-1000 rpm. This polishing process may be a deterministic polishing technique as known in the art.

In one or more embodiments, the step of bonding may include: heating at least one of the glass substrate and the donor semiconductor wafer; bringing the glass substrate into direct or indirect contact with the donor semiconductor wafer through the exfoliation layer; and applying a voltage potential across the glass substrate and the donor semiconductor wafer to induce the bond. The temperature of the glass substrate and the semiconductor wafer may be elevated to within about 150 degrees C. of the strain point of the glass substrate. The temperatures of the glass substrate and the semiconductor wafer may be elevated to different levels. The voltage potential across the glass substrate and the semiconductor wafer may be between about 100 to 2000 volts. Stress may be induced by cooling the bonded glass substrate, exfoliation layer, and donor semiconductor wafer such that a fracture occurs substantially at the exfoliation layer.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 2 is a flow diagram illustrating process steps that may be carried out to produce the SiOG structure of FIG. 1;

DETAILED DESCRIPTION OF THE PRESENT INVENTION

Figure 1:
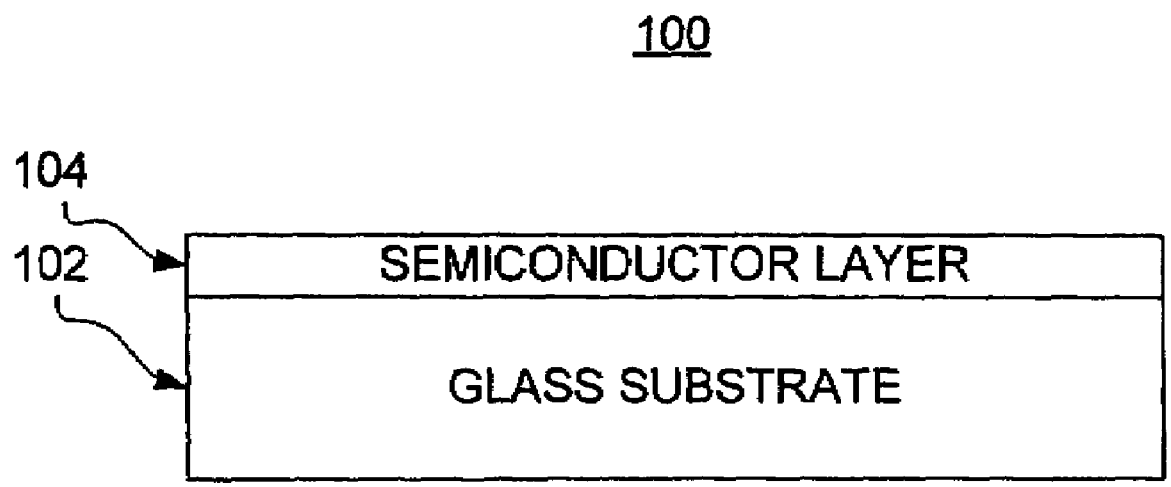
FIG. 1 is a block diagram illustrating the structure of an SiOG device in accordance with one or more embodiments of the present invention.

With reference to the drawings, wherein like numerals indicate like elements, there is shown in FIG. 1 an SiOG structure 100 in accordance with one or more embodiments of the present invention. The SiOG structure 100 may include a glass substrate 102, and a semiconductor layer 104. The SiOG structure 100 has suitable uses in connection with fabricating thin film transistors (TFTs), e.g., for display applications, including organic light-emitting diode (OLED) displays and liquid crystal displays (LCDs), integrated circuits, photovoltaic devices, etc.

The semiconductor material of the layer 104 may be in the form of a substantially single-crystal material. The term "substantially" is used in describing the layer 104 to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 may be formed from an oxide glass or an oxide glass-ceramic. Although not required, the embodiments described herein may include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa.s). As between oxide glasses and oxide glass-ceramics, the glasses may have the advantage of being simpler to manufacture, thus making them more widely available and less expensive.

By way of example, the glass substrate 102 may be formed from glass substrates containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

The glass substrate may have a thickness in the range of about 0.1 mm to about 10 mm, such as in the range of about 0.5 mm to about 3 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A lower limit on the thickness of the glass substrate 102 may be about 1 micron.

In general, the glass substrate 102 should be thick enough to support the semiconductor layer 104 through the bonding process steps, as well as subsequent processing performed on the SiOG structure 100. Although there is no theoretical upper limit on the thickness of the glass substrate 102, a thickness beyond that needed for the support function or that desired for the ultimate SiOG structure 100 might not be advantageous since the greater the thickness of the glass substrate 102, the more difficult it will be to accomplish at least some of the process steps in forming the SiOG structure 100.

The oxide glass or oxide glass-ceramic substrate 102 may be silica-based. Thus, the mole percent of $SiO_2$ in the oxide glass or oxide glass-ceramic may be greater than 30 mole % and may be greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less advantageous because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not advantageous because of their higher cost. As will be discussed in more detail below, in one or more embodiments, the glass or glass-ceramic substrate 102 is designed to match a coefficient of thermal expansion (CTE) of one or more semiconductor materials (e.g., silicon, germanium, etc.) of the layer 104 that are bonded thereto. The CTE match ensures desirable mechanical properties during heating cycles of the deposition process.

For certain applications, e.g., display applications, the glass or glass-ceramic 102 may be transparent in the visible, near UV, and/or IR wavelength ranges, e.g., the glass or glass ceramic 102 may be transparent in the 350 nm to 2 micron wavelength range.

Although the glass substrate 102 may be composed of a single glass or glass-ceramic layer, laminated structures can be used if desired. When laminated structures are used, the layer of the laminate closest to the semiconductor layer 104 may have the properties discussed herein for a glass substrate 102 composed of a single glass or glass-ceramic. Layers farther from the semiconductor layer 104 may also have those properties, but may have relaxed properties because they do not directly interact with the semiconductor layer 104. In the latter case, the glass substrate 102 is considered to have ended when the properties specified for a glass substrate 102 are no longer satisfied.

Figure 3:
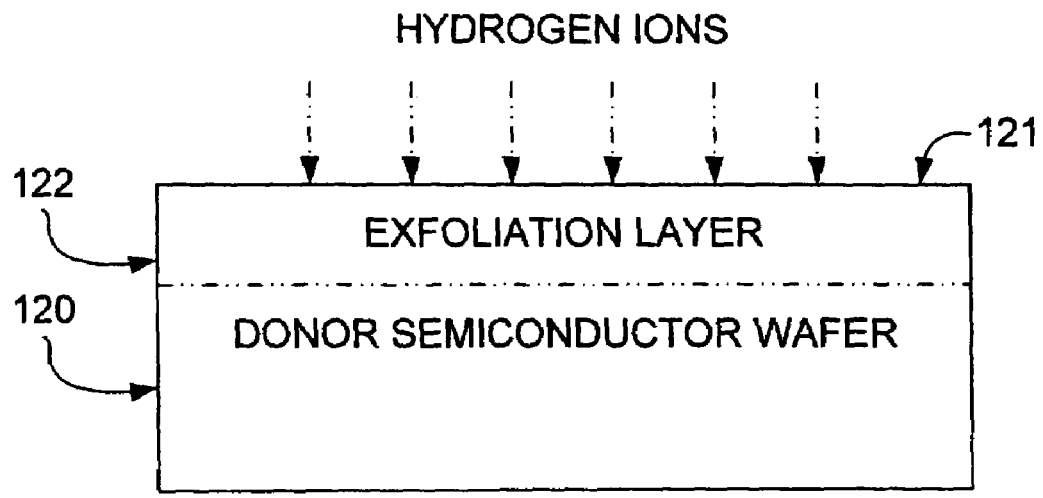
FIGS. 3-6 are block diagrams illustrating intermediate and final structures formed using the process of FIG. 2.

Reference is now made to FIGS. 2-6. FIG. 2 illustrates process steps that may be carried out in order to produce the SiOG structure 100 of FIG. 1 (and/or other embodiments disclosed herein), while FIGS. 3-6 illustrate intermediate structures that may be formed in carrying out the process of FIG. 2. Turning first to FIGS. 2 and 3, at action 202, an implantation surface 121 of a donor semiconductor wafer 120 is prepared, such as by polishing, cleaning, etc. to produce a relatively flat and uniform implantation surface 121 suitable for bonding to the glass or glass-ceramic substrate 102. For the purposes of discussion, the semiconductor wafer 120 may be a substantially single crystal Si wafer, although as discussed above any other suitable semiconductor conductor material may be employed.

At action 204, an exfoliation layer 122 is created by subjecting the implantation surface 121 to one or more ion implantation processes to create a weakened region below the implantation surface 121 of the donor semiconductor wafer 120. Although the embodiments of the present invention are not limited to any particular method of forming the exfoliation layer 122, one suitable method dictates that the implantation surface 121 of the donor semiconductor wafer 120 may be subject to a hydrogen ion implantation process to at least initiate the creation of the exfoliation layer 122 in the donor semiconductor wafer 120. The implantation energy may be adjusted using conventional techniques to achieve a general thickness of the exfoliation layer 122, such as between about 300-500 nm. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 122 may be employed without departing from the spirit and scope of the present invention.

At action 206 the donor semiconductor wafer 120 may be treated to reduce, for example, the hydrogen ion concentration on the implantation surface 121. For example, the donor semiconductor wafer 120 may be washed and cleaned and the implantation donor surface 121 of the exfoliation layer 122 may be subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surface of the silicon wafer hydrophilic. The treatment may be carried out at room temperature for the oxygen plasma and at temperature between 25-150° C. for the ammonia or acid treatments.

Figure 4:
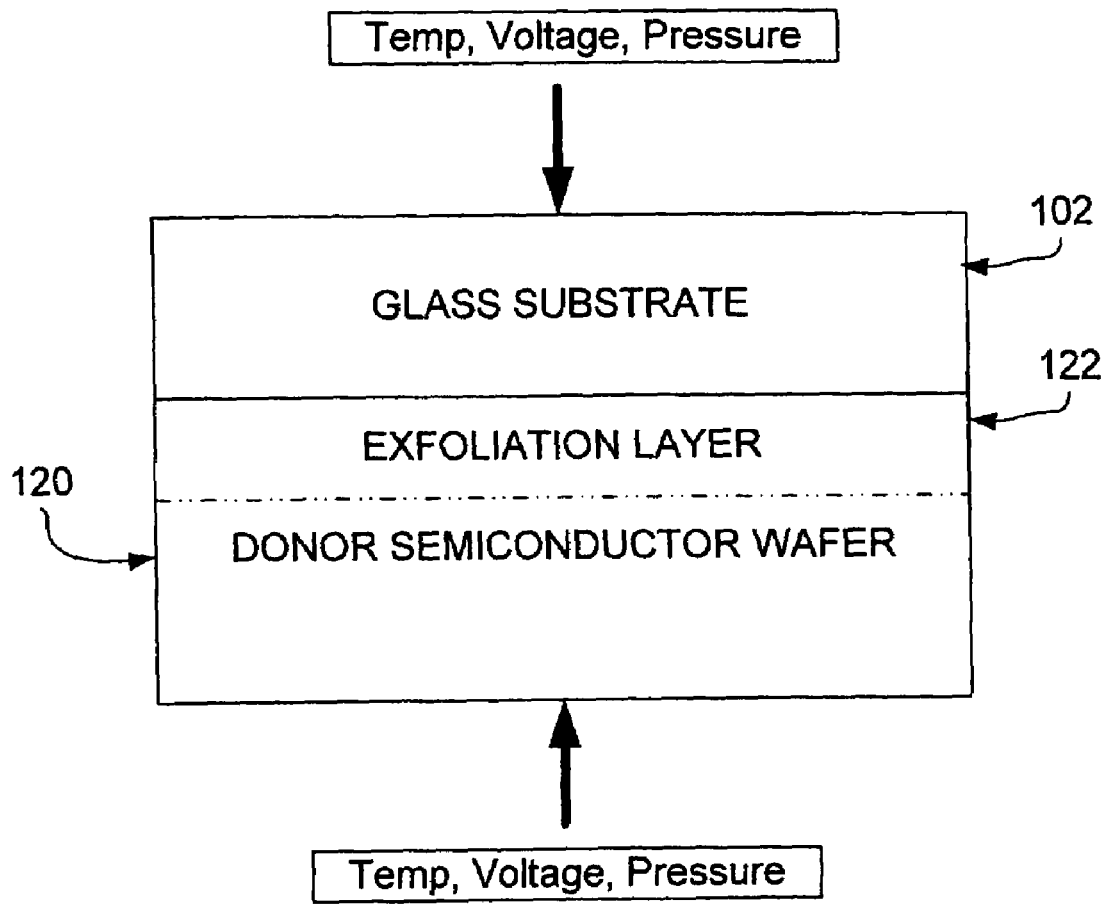

With reference to FIGS. 2 and 4, at action 208 the glass substrate 102 may be bonded to the exfoliation layer 122 using an electrolysis process. A suitable electrolysis bonding process is described in U.S. Patent Application No. 2004/0229444, the entire disclosure of which is hereby incorporated by reference. Portions of this process are discussed below. In the bonding process, appropriate surface cleaning of the glass substrate 102 (and the exfoliation layer 122 if not done already) may be carried out. Thereafter, the intermediate structures are brought into direct or indirect contact to achieve the arrangement schematically illustrated in FIG. 4. Prior to or after the contact, the structure(s) comprising the donor semiconductor wafer 120, the exfoliation layer 122, and the glass substrate 102 are heated under a differential temperature gradient. The glass substrate 102 may be heated to a higher temperature than the donor semiconductor wafer 120 and exfoliation layer 122. By way of example, the temperature difference between the glass substrate 102 and the donor semiconductor wafer 120 (and the exfoliation later 122) is at least 1 degree C., although the difference may be as high as about 100 to about 150 degrees C. This temperature differential is desirable for a glass having a coefficient of thermal expansion (CTE) matched to that of the donor semiconductor wafer 120 (such as matched to the CTE of silicon) since it facilitates later separation of the exfoliation layer 122 from the semiconductor wafer 120 due to thermal stresses.

Once the temperature differential between the glass substrate 102 and the donor semiconductor wafer 120 is stabilized, mechanical pressure is applied to the intermediate assembly. The pressure range may be between about 1 to about 50 psi. Application of higher pressures, e.g., pressures above 100 psi, might cause breakage of the glass substrate 102.

The glass substrate 102 and the donor semiconductor wafer 120 may be taken to a temperature within about ±150 degrees C. of the strain point of the glass substrate 102.

Next, a voltage is applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. This accomplishes two functions: (i) an alkali or alkaline earth ion free interface is created; and (ii) the glass substrate 102 becomes very reactive and bonds strongly to the exfoliation layer 122 of the donor semiconductor wafer 120 with the application of heat at relatively low temperatures.

Figure 5:
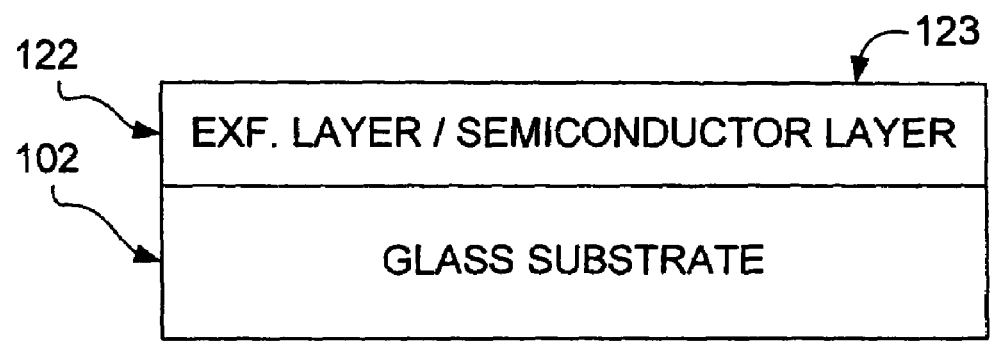

With reference to FIGS. 2 and 5, at action 210 after the intermediate assembly is held under the above conditions for some time (e.g., approximately 1 hour or less), the voltage is removed and the intermediate assembly is allowed to cool to room temperature. The donor semiconductor wafer 120 and the glass substrate 102 are then separated, which may include some peeling if they have not already become completely free, to obtain a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

As illustrated in FIG. 5, after separation the resulting structure may include the glass substrate 102 and the exfoliation layer 122 of semiconductor material bonded thereto. The cleaved surface 123 of the SOI structure just after exfoliation may exhibit excessive surface roughness, excessive silicon layer thickness, and implantation damage of the silicon layer (e.g., due to the formation of an amorphized silicon layer). In some cases, the amorphized silicon layer may be on the order of about 50-150 nm in thickness. In addition, depending on the implantation energy and implantation time, the thickness of the exfoliation layer 122 may be on the order of about 300-500 nm. It is assumed for the purposes of discussion that the final thickness of the semiconductor layer 104 should be lower than 1 micron, for example, less than about 100 nm, such as 40 nm or lower.

Figure 6:
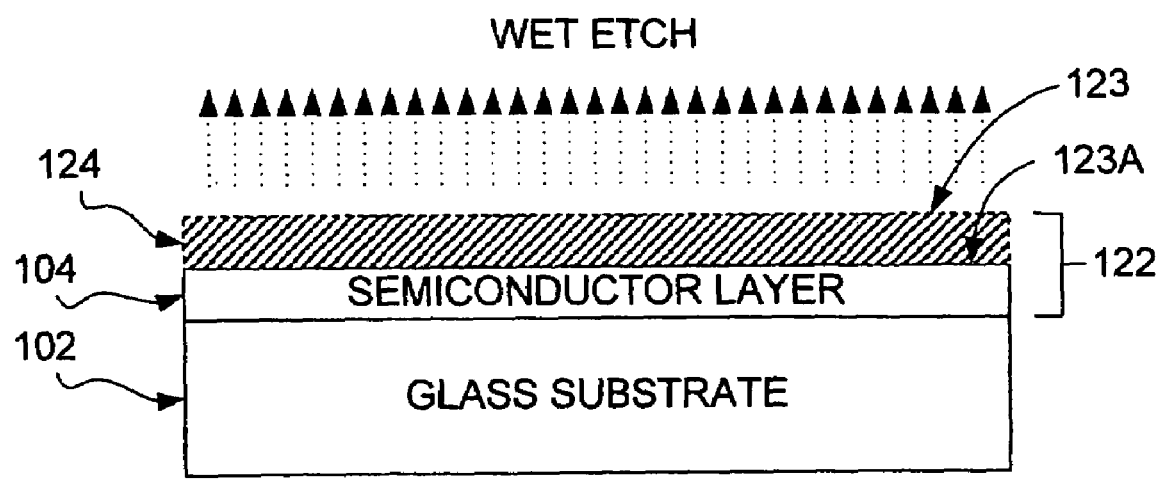

Accordingly, with reference to FIG. 2, action 212 and FIG. 6, the cleaved surface 123 is subject to post processing, which may include subjecting the cleaved surface 123 to a relatively low temperature wet etching process. The temperature of the wet etching process may be between about 20-100° C., or between about 20-60° C., such as for example, 25° C. It is preferred that the wet etching process be conducted without employing a hydrogen annealing process before or after the wet etching process.

Figure 7:
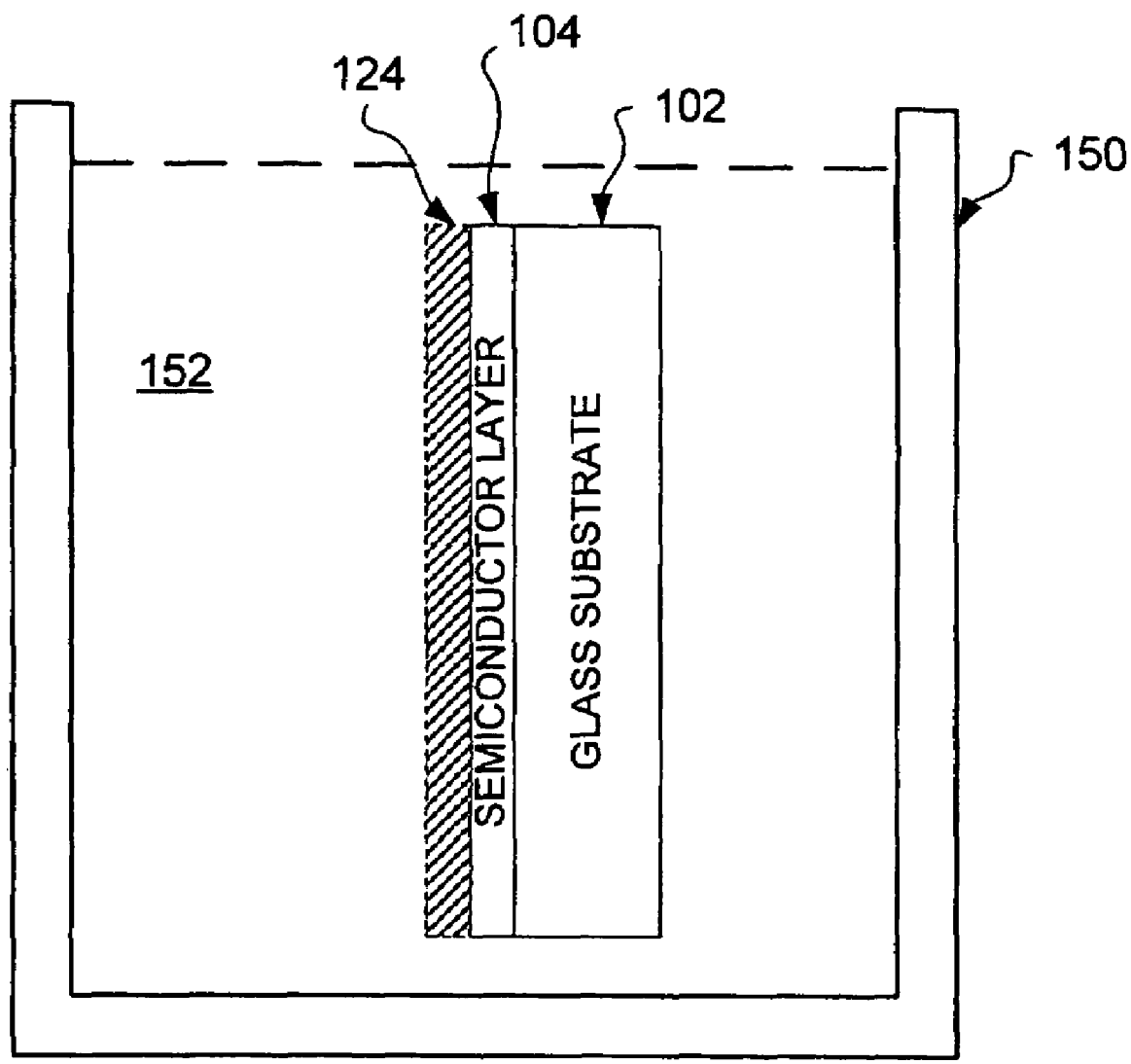
FIG. 7 is a block diagram illustrating an etching bath structure for processing an intermediate structure to produce the SiOG of FIG. 1.

With reference to FIG. 7, the wet etching process may be carried out in an etching bath 150, which may be temperature controlled. The bath 150 may include an etching solution 152, into which the SOI intermediate structure is disposed. The etching process is intended to remove a portion 124 of the exfoliation layer 122, leaving the semiconductor layer 104. The etching solution 152 may include one of an acid solution and a base solution. By way of example, when an acid solution is employed, the etching solution 152 may include at least one of hydrofluoric acid, nitric acid, and acetic acid. When a base solution is used, the etching solution 152 may include one or more of KOH, NH4OH, tetramethyl ammonium hydroxide (TMAH), etc. The etching solution 152 may alternatively or additionally include an additive, such as isopropyl alcohol, hydrogen peroxide or ozonated dionized water.

The etching process may include subjecting the cleaved surface 123 to agitation of the etching solution 152. For example, the bath 150 may be equipped such that the agitation may include stirring the solution, such as by magnetic stirring. Alternatively or in addition, the bath 150 may be equipped such that the agitation may include ultrasonic and/or megasonic wave propagation within the solution 152. It is understood that other agitation techniques may be employed, such as by using a spray application of the etching solution 152 to the cleaved surface 123.

The etching process (and thus the material 124 removal and surface roughness) is controlled via one or more of the etchant composition, etching time, and etching temperature. When the desired amount of material 124 has been removed, the etching process may be terminated, and the etchant may be neutralized (such as by applying a water rinse or another neutralizing agent). This results in a relatively smooth, etched surface 123A of the semiconductor layer 104 of the SiOG structure 100.

Figure 8:
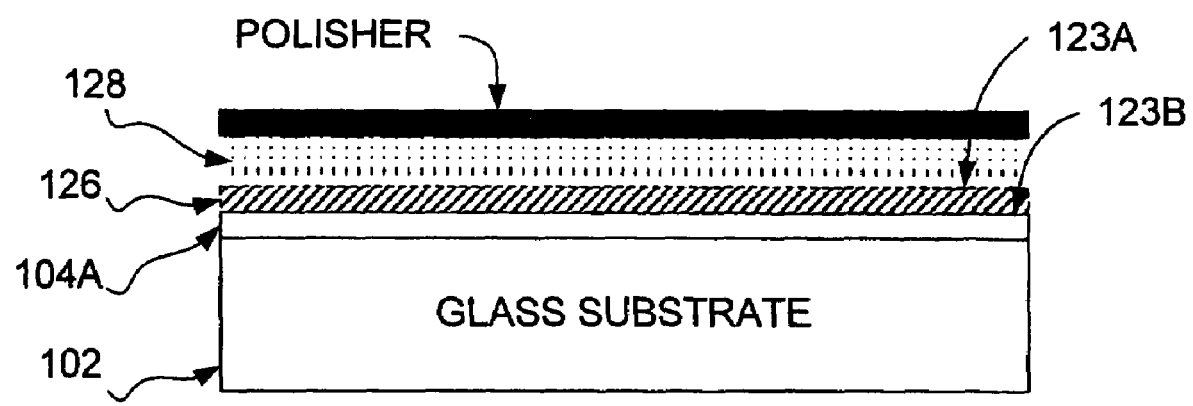
FIG. 8 is a block diagram illustrating an alternative or additional polishing process that may be carried out in conjunction with the etching process to produce an alternative SiOG structure.

With reference to FIG. 2, action 214, and FIG. 8, the process may additionally or alternatively include subjecting the etched surface 123A of the semiconductor layer 104 to polishing. The intent of the polishing step is to remove additional material 126 from the semiconductor layer 104 by polishing the etched surface 123A down to a polished surface 123B. The polishing step may include using polishing (or buffing) equipment to buff the etched surface 123A using a silica based slurry or similar material known in the art in the semiconductor industry. The polishing pressure may be between about 1 and 100 psi, the polishing platen speed may be between about 25-1000 rpm. This polishing, process may be a deterministic polishing technique as known in the art.

Following the polishing step, the remaining semiconductor layer 104A may be substantially thinner and/or smoother than would otherwise be obtained by etching alone.

Alternative embodiments of the invention will now be described with reference to the aforementioned SiOG processes and further details. For example, a result of separating the exfoliation layer 122 from the donor semiconductor wafer 120 may produce a first cleaved surface of the donor semiconductor wafer 120 and a second cleaved surface 123 of the exfoliation layer 122. As previously discussed, the process of wet etching may be applied to the second cleaved surface 123 of the exfoliation layer 122. Additionally or alternatively, the process of wet etching may be applied to the first cleaved surface of the donor semiconductor wafer 120 (using one or more of the techniques described above).

In another embodiment of the present invention, the donor semiconductor wafer may be part of a donor structure, including a substantially single crystal donor semiconductor wafer 120, and an epitaxial semiconductor layer disposed on the donor semiconductor wafer. (Details of an epitaxially grown semiconductor layer in an SOI context may be found in co-pending U.S. patent application Ser. No. 11/159,889, filed Jun. 23, 2005, the entire disclosure of which is incorporated herein by reference.) The exfoliation layer 122, therefore, may be formed substantially from the epitaxial semiconductor layer (and may also include some of the single crystal donor semiconductor material from the wafer 120). Thus, the aforementioned wet etch process may be applied to the cleaved surface of an exfoliation layer formed substantially of epitaxial semiconductor material and/or a combination of epitaxial semiconductor material and single crystal semiconductor material.

In still another embodiment of the present invention the aforementioned polishing process may be applied to the etched surface of the donor semiconductor wafer 120.

Example 1

An experiment was conducted to demonstrate the applicability of the aforementioned thinning process on an SiOG structure. An SiOG structure with a 500 nm thick silicon exfoliation layer was submerged in a 35% KOH etching solution and etched for four minutes at about 25° C. Magnetic stirring was employed to agitate the etching solution. The SiOG structure was then removed from the etching solution and washed with deionized water to stop the etching action. The surface roughness of the etched surface was then measured, which revealed a roughness of 7.1 angstroms (RMS). The thickness of the semiconductor layer was about 470 nm with a uniformity deviation of well under 10 nm for most of the etched surface. The semiconductor layer thickness measurement was used to calculate the etching rate, which was 7 nm/minute.

Example 2

An SiOG structure with a 500 nm thick silicon exfoliation layer was submerged in a 25% KOH etching solution and etched for four minutes at about 25° C. Ultrasonic agitation was employed to agitate the etching solution. The SiOG structure was then removed from the etching solution and washed with deionized water to stop the etching action. The surface roughness of the etched surface was then measured, which revealed a roughness of 7.6 angstroms (RMS). The thickness of the semiconductor layer was about 344 nm with a uniformity deviation of about 8 nm. The etching rate was 38 nm/minute.

Example 3

An SiOG structure with a 500 nm thick silicon exfoliation layer was submerged in a 45% KOH etching solution and etched for four minutes at about 25° C. Magnetic stirring was employed to agitate the etching solution. The SiOG structure was the removed from the etching solution and washed with deionized water to stop the etching action. The surface roughness of the etched surface was 8.2 angstroms (RMS). The thickness of the semiconductor layer was about 438 nm with a uniformity deviation of about 8 nm. The etching rate was 18 nm/minute.

Example 4

The experiment of example 3 was repeated using ultrasonic agitation of the etching solution. The surface roughness of the etched surface was 9.7 angstroms (RMS). The thickness of the semiconductor layer was about 414 nm with a uniformity deviation of about 6 nm. The etching rate was 21 nm/minute.

Example 5

An SiOG structure with a 500 nm thick silicon exfoliation layer was submerged in a 15% ammonia (NH4OH) etching solution and etched for four minutes at about 25° C. Ultrasonic agitation was employed to agitate the etching solution. The SiOG structure was then removed from the etching solution and washed with deionized water to stop the etching action. The surface roughness of the etched surface was 9 angstroms (RMS). The thickness of the semiconductor layer was about 472 nm with a uniformity deviation of about 46 nm. The etching rate was 6 nm/minute.

Example 6

An SiOG structure with a 500 nm thick silicon exfoliation layer was submerged in a 157:1:10 mixture, by volume, of HNO3(70%, wt %):HF (49%, wt %): CH3COOH (86%, wt %) and etched for two and a half minutes at about 25° C. 1 MHz megasonic agitation was employed to agitate the etching solution. The SiOG structure was then removed from the etching solution and washed with deionized water to stop the etching action. The surface roughness of the etched surface was 2-4 angstroms (RMS). The thickness of the semiconductor layer had a thickness of about 349 nm with a uniformity deviation of about 11 nm. The etching rate was 64.8 nm/minute.

Example 7

An SiOG structure with a 500 nm thick silicon exfoliation layer was submerged in a ozonated HF solution for and etched for 20 minutes at about 25° C. The O3 concentration was maintained at 55~60 ppm and the 49 wt % HF was diluted 1:100 by volume with deionized water. Megasonic agitation was employed to agitate the etching solution. The SiOG structure was then removed from the etching solution and washed with deionized water to stop the etching action. The surface roughness of the etched surface was 2-5 angstroms (RMS). The thickness of the semiconductor layer was about 232 nm with a uniformity deviation of about 23 nm. The etching rate was 11.5 nm/minute.

Example 8

To demonstrate the applicability of the wet etch process to prepare donor semiconductor wafers for reuse in the SiOG process, experiments were conducted with various concentrations of KOH solutions, and acid solutions, at room temperature. Three donor silicon wafers were dipped in 25% KOH solution in a beaker at 25° C. and etched for 20 minutes, 40 minutes and 60 minutes, respectively, using ultrasonic agitation. The wafers were then removed from solution and immediately rinsed with DI wafer. The etch rate was 50 nm/minute and the surface roughness was 6-8 angstroms (RMS). Etching for 40 minutes and more can remove surface defects such as circular voids.

Example 9

The experiment of Example 8 was repeated with KOH concentrations of 10%, 35% and 45% at 25° C. in an ultrasonic bath, each for 6 minutes, followed by the same rinsing procedure. Post etched surface roughness were found to be in the range of 6-9 angstroms (RMS).

Example 10

The experiment of Example 8 was repeated where saturated IPA was added to 10%, 25%, 35% and 45% concentration KOH solutions. The donor silicon wafers were dipped in the solutions for 6 minutes using ultrasonic agitation. The wafers were rinsed in DI water as before. Post etched surface roughness was measured, which were all within the range of 6-8 angstroms (RMS).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor on glass structure, comprising:
    subjecting an implantation surface of a donor semiconductor wafer to an ion implantation process to create an exfoliation layer of the donor semiconductor wafer;
    bonding the implantation surface of the exfoliation layer to a glass substrate using electrolysis;
    separating the exfoliation layer from the donor semiconductor wafer, thereby exposing at least one cleaved surface; and
    subjecting the at least one cleaved surface to a wet etching process at a temperature of between about 20-100° C. without employing a hydrogen annealing process before or after the wet etching process.

2. The method of claim 1, wherein the at least one cleaved surface includes a first cleaved surface of the donor semiconductor wafer and a second cleaved surface of the exfoliation layer.

3. The method of claim 1, wherein the wet etching process is conducted at a temperature of between about 20-60° C.

4. The method of claim 1, wherein the wet etching process is conducted at a temperature of about 25° C.

5. The method of claim 1, wherein the wet etching process includes subjecting the at least one cleaved surface to one of an acid solution and a base solution.

6. The method of claim 1, wherein the etching process includes subjecting the at least one cleaved surface to agitation of a solution containing an etchant.

7. The method of claim 1, wherein the step of bonding includes:
    heating at least one of the glass substrate and the donor semiconductor wafer;
    bringing the glass substrate into direct or indirect contact with the donor semiconductor wafer through the exfoliation layer; and
    applying a voltage potential across the glass substrate and the donor semiconductor wafer to induce the bond.

8. The method of claim 1, wherein the donor semiconductor wafer is taken from the group consisting of: silicon (Si), germanium-doped silicon (SiGe), silicon carbide (SiC), germanium (Ge), gallium arsenide (GaAs), GaP, and InP.

9. The method of claim 2, wherein the step of wet etching is applied to at least the second cleaved surface of the exfoliation layer.

10. The method of claim 2, wherein the step of wet etching is applied to at least the first cleaved surface of the donor semiconductor wafer.

11. The method of claim 5, wherein the acid solution includes at least one of hydrofluoric acid, nitric acid, and acetic acid.

12. The method of claim 5 wherein the solution includes water.

13. The method of claim 5, wherein the solution includes a base etchant.

14. The method of claim 5, wherein the solution includes an additive.

15. The method of claim 6, wherein the agitation includes at least one of stirring the solution, magnetic stirring of the solution, ultrasonic wave propagation within the solution, megasonic wave propagation within the solution, and spray application of the solution.

16. The method of claim 13, wherein the base etchant is taken from the group consisting of KOH, NH4OH, tetramethyl ammonium hydroxide (TMAH).

17. The method of claim 14, wherein the additive is one of isopropyl alcohol, hydrogen peroxide and ozonated water.

18. A method of forming a semiconductor on glass structure, comprising:
    bonding a surface of a donor semiconductor structure to a glass substrate using electrolysis;
    separating a layer, bonded to the glass substrate, from the donor semiconductor structure by exfoliation, thereby exposing at least one cleaved surface; and
    subjecting the at least one cleaved surface to a wet etching process at a temperature of between about 20-100° C. without employing a hydrogen annealing process before or after the wet etching process.

19. The method of claim 18, wherein the donor semiconductor structure includes a substantially single crystal donor semiconductor wafer, and the separated layer is formed substantially from the single crystal donor semiconductor wafer material.

20. The method of claim 18, wherein the donor semiconductor structure includes a donor semiconductor wafer and an epitaxial semiconductor layer disposed on the donor semiconductor wafer, and the separated layer is formed substantially from the epitaxial semiconductor layer.

21. The method of claim 18, wherein the at least one cleaved surface includes a first cleaved surface of the donor semiconductor structure and a second cleaved surface of the separated layer.

22. The method of claim 18, further comprising subjecting an etched surface of at least one of the separated layer and the donor semiconductor structure to polishing.

23. The method of claim 21, wherein the step of wet etching is applied to at least the second cleaved surface of the separated layer.

24. The method of claim 21, wherein the step of wet etching is applied to at least the first cleaved surface of the donor semiconductor structure.

25. The method of claim 22, wherein the polishing step includes buffing the etched surface using a silica based slurry.

26. The method of claim 25, wherein a polishing pressure is between about 1 and 100 psi.

27. The method of claim 25, wherein a polishing platen speed is between about 25-1000 rpm.

28. The method of claim 25, where the polishing process is a deterministic polishing technique.

* * * * *